(12) United States Patent
Kawase et al.

(10) Patent No.: US 6,603,783 B1
(45) Date of Patent: Aug. 5, 2003

(54) SURFACE EMITTING TYPE SEMICONDUCTOR LASER

(75) Inventors: Takeo Kawase, Cambridge (GB); Takeo Kaneko, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/632,783

(22) Filed: Aug. 4, 2000

Related U.S. Application Data

(63) Continuation of application No. 09/269,477, filed on Mar. 29, 1999.

(30) Foreign Application Priority Data

Jul. 29, 1997 (JP) ............................................... 9-203193

(51) Int. Cl.[7] ................................................. H01S 5/00
(52) U.S. Cl. ............................. 372/43; 372/45; 372/27; 372/98; 372/106
(58) Field of Search ........................ 372/26, 27, 43–46, 372/98, 99, 106

(56) References Cited

U.S. PATENT DOCUMENTS

| | | | | |
|---|---|---|---|---|
| 5,331,654 A | * | 7/1994 | Jewell et al. ................. | 372/45 |
| 5,412,680 A | * | 5/1995 | Swirhun et al. .............. | 372/45 |
| 5,469,458 A | | 11/1995 | Numai | |
| 5,879,961 A | * | 3/1999 | Scott ........................... | 438/32 |
| 5,903,585 A | * | 5/1999 | Dawson et al. .............. | 372/45 |
| 6,002,705 A | * | 12/1999 | Thornton ..................... | 372/96 |
| 6,188,711 B1 | * | 2/2001 | Corzine et al. ............... | 372/96 |

FOREIGN PATENT DOCUMENTS

| | | |
|---|---|---|
| JP | A-6-224515 | 8/1994 |
| JP | A-6-326409 | 11/1994 |
| JP | A-7-22706 | 1/1995 |
| JP | A-8-181384 | 7/1996 |
| JP | A-9-64462 | 3/1997 |
| JP | A-9-116228 | 5/1997 |
| WO | WO 98/53537 | 11/1998 |

OTHER PUBLICATIONS van Doorn; Tailoring the Birefringence in a Vertical–cavity Semiconductor Laser; Appl. Phys. Lett. vol. 69, No. 24, Dec. 9, 1996; pp. 3635–3637.

Mukaihara, T., et al. "Engineered Polarization Control of GaAs/AlGaAs Surface–Emitting Lasers by Anisotropic Stress from Elliptical Etched Substrate Hole", *IEEE Photonics Technology Letters*, vol. 5, No. 2, Feb. 1993, pp 133–135.

Shimuzi, M., et al. "Polarisation Control for Surface Emitting Lasers", *Electronic Letters*, vol. 27, No. 12, Jun. 6, 1991, pp. 1067–1071.

\* cited by examiner

*Primary Examiner*—Hemang Sanghavi
*Assistant Examiner*—Scott Knauss
(74) *Attorney, Agent, or Firm*—Oliff & Berridge, PLC

(57) ABSTRACT

In order to facilitate control of the polarization plane of a laser beam emerging from a surface-emitting-type semiconductor laser in a specific direction and to suppress occurrence of fluctuations and switching of the polarization plane depending on the optical output and the environmental temperature, a strain generating section (19) is arranged adjacent to a resonator (10B) of a semiconductor laser. The strain generating section (19) impresses anisotropic stress to the resonator (10B) to generate strain, resulting in birefringence and dependence of the gain on the polarization in the resonator (10A). This enables stabilized control of the polarization plane.

5 Claims, 7 Drawing Sheets

(a)

(B) A-A' CROSS-SECTION (a)

(b)

(a)

(B) A-A' CROSS-SECTION (a)

(B) A-A' CROSS-SECTION (a)

(B) A-A' CROSS-SECTION

SURFACE EMITTING TYPE SEMICONDUCTOR LASER

This is a Continuation of application Ser. No. 09/269,477 filed Mar. 29, 1999. The entire disclosure of the prior application(s) is hereby incorporated by reference herein in its entirety.

BACKGROUND OF THE INVENTION

1. Field of the Invention

The present invention relates to surface-emitting-type semiconductor lasers that emit laser beams perpendicularly to semiconductive substrates.

2. Related Art

Semiconductor lasers are classified into edge-emitting-type semiconductor lasers that emit laser beams from cleavage planes and surface-emitting-type semiconductor lasers that emit laser beams perpendicularly to semiconductive substrates. In semiconductor lasers, an active layer having a gain with respect to light is disposed in a resonator provided between mirrors so that light moving back and forth in the resonator is amplified until oscillation occurs. Edge-emitting-type semiconductor lasers have been widely used since they have simplified configurations having mirrors as cleavage planes and can produce high-output laser beams. On the other hand, surface-emitting-type semiconductor lasers have semiconductive multilayered mirrors or dielectric mirrors. Thus, they have complicated configurations; however, they have the following advantages: (1) low threshold currents, (2) ability to be arrayed on semiconductive substrates, (3) a single mode of longitudinal oscillation, (4) stable oscillation wavelength, and (5) circular (conical) beams being obtainable.

Surface-emitting-type semiconductor lasers, however, have a problem of difficult control of polarization planes. Since an edge-emitting-type semiconductor laser has a resonator consisting of a waveguide, TE waves have larger reflectance compared with TM waves on the end faces of the waveguide, and thus the TE waves having an electric field vector parallel to a semiconductive substrate will oscillate. Light emerging from the edge-emitting-type semiconductor laser has a stable polarization plane without fluctuation. In contrast, in a surface-emitting-type semiconductor laser, it is difficult to enhance the reflectance of mirrors with respect to light polarized in a specific direction and to raise the gain of the activation layer. Since the surface-emitting-type semiconductor laser has an isotropic configuration with respect to polarized light, it has problems such as fluctuation and instability of the polarization direction. Reflectance of most beam splitters and diffraction gratings depends on the polarization direction, hence fluctuation of the polarization direction hinders use of the semiconductor laser when it is mounted in an optical apparatus. Furthermore, an unstable polarization plane causes irregular movement of the orthogonal polarization directions on the polarization plane, which will generate noise.

The following are countermeasures for solving this problem. In a first method, thin metallic lines are arranged in one direction on a semiconductive multilayered mirror to increase the reflectance of the mirror with respect to the polarized light in a specific direction. Since the reflectance increases with respect to light having a polarization direction parallel to the thin metallic lines, this method is effective to some extent for stabilization of the polarization plane; however, the thin metallic lines must have a size which is less than the wavelength of light; hence it is difficult to form them. An alternative method uses dependence of the gain on crystal orientation, in which an active layer is formed on a high-index oriented crystal plane, such as a (311)A plane or a (311)B plane, to raise the gain of the active layer with respect to polarized light in a predetermined direction. This method, however, has disadvantages, such as difficulty in growing crystals and in obtaining high output.

In addition, an attempted method is control of polarized light by a resonator having a specified shape. It has been found that a rectangular resonator facilitates orientation of polarized light in the short or long side direction, and this fact suggests possibility of ready control of the polarized light. Its cause, however, has not been clarified, and the method has less reproducibility.

SUMMARY OF THE INVENTION

Accordingly, a surface-emitting-type semiconductor laser in accordance with the present invention includes at least one strain generating section adjacent to a resonator. This configuration allows control of orientation in a specific direction of the polarization plane of light emerging from the opening of the resonator; hence the orientation of the polarized light is stabilized regardless of changes in the operating environment. Furthermore, the orientation of the polarized light is not irregularly switched, and thus noise is not generated. An effective configuration includes two strain generating sections disposed on a straight line which passes through the center of the resonator, so as to sandwich the resonator. The polarization plane is thereby stabilized in a direction parallel to or perpendicular to the straight line passing through the strain generating sections.

An effective distance between the boundary of the resonator and the boundary of each strain generating section for controlling the polarization plane is in a range of 0 $\mu$m to 100 $\mu$m. Herein, "0 $\mu$m" means that the resonator can come into contact with the strain generating section.

The strain generating section is composed of a metal, a dielectric material, or a semiconductor formed so as to be bonded to a semiconductor continuously extending from the resonator. This enables control of the polarization plane without complication of the production process. Alternatively, it may be composed of a dielectric material or a semiconductor formed in a semiconductor continuously extending from the resonator. In this case, the strain generating section can also be formed during the production process of the resonator; hence effective control of the polarization plane can be performed without increased production cost.

It is preferable that the main component of the dielectric material formed in the semiconductor be aluminum oxide, because it can be readily formed by selective oxidation of the AlAs layer in the production process. Since it can prevent an excess current in the strain generating section, heating of the device is reduced and electrical power consumed is reduced as much as possible. Complete oxidation of the AlAs layer is not necessary as long as the area of the residual AlAs layer is 9 $\mu$m$^2$ or less. In an AlAs layer having such an area, the effects of the excess current are not significant. When the AlAs layer remains in the strain generating section, more satisfactorily results will be obtained in view of reliability of the device.

The strain generating section is preferably an indented section which is provided on a semiconductor continuously extending from the resonator. Such a configuration can effectively control polarization when the distance between the surface of the semiconductive layer and the activation layer is relatively large, as in a resonator formed by proton implantation.

Preferably, a plurality of resonators having strain generating sections are provided on a single semiconductive piece, and directions of arrangement of the resonators and the strain generating sections are different from each other. Laser beams having different polarization directions can thereby emerge from one semiconductive piece.

DETAILED DESCRIPTION OF PREFERRED EMBODIMENTS

Figure 1:
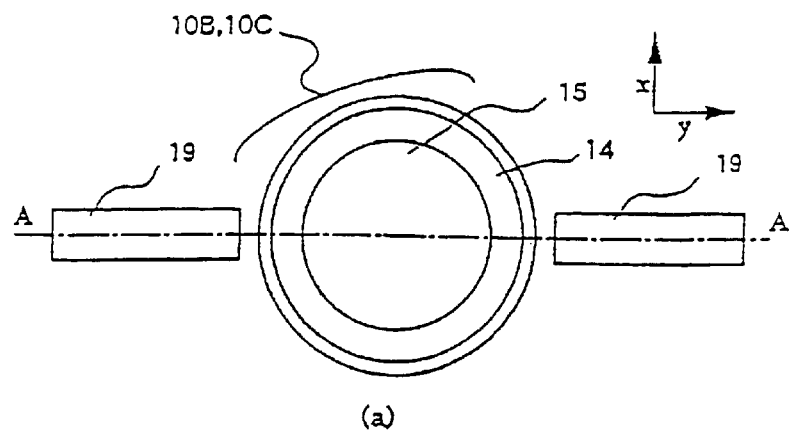
FIGS. 1(a) and 1(b) show a configuration and a cross-section, respectively, of a first embodiment of a surface-emitting-type semiconductor laser in accordance with the present invention.
Figure 1:
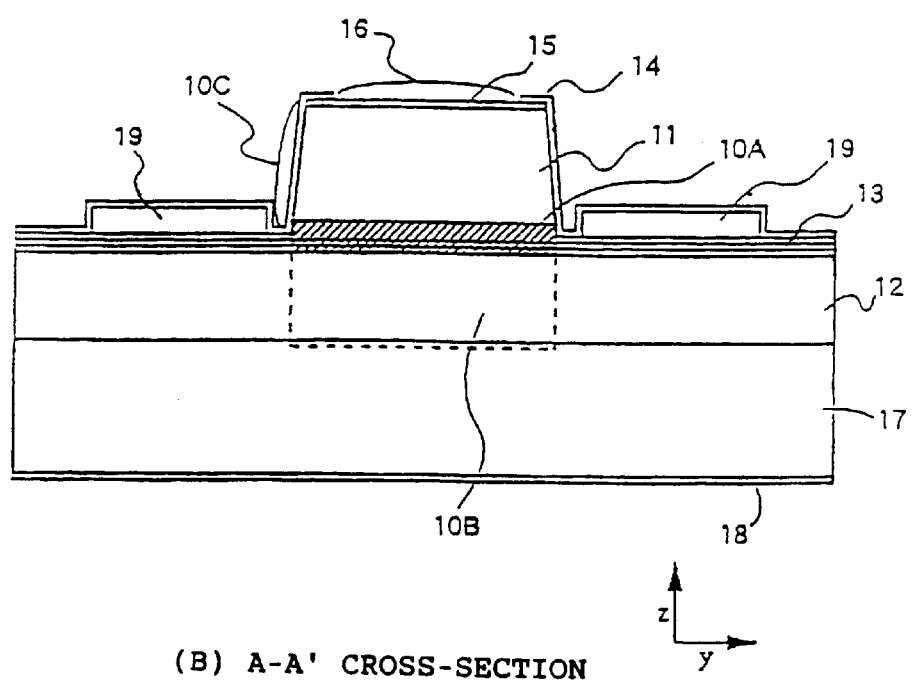

Preferred embodiments of the surface-emitting-type semiconductor laser in accordance with the present invention will now be described in detail based on preferred embodiments shown in the drawings.

First Embodiment

The surface-emitting-type semiconductor laser in accordance with the present invention will be described with reference to the drawings. FIG. 1 includes a schematic view and a cross-sectional view of a surface-emitting-type semiconductor laser. The surface-emitting-type semiconductor laser consists of a resonator 10A including an active layer 13 disposed between an upper semiconductive multilayered mirror 11 and a lower semiconductive multilayered mirror 12. The resonator strictly represents a shaded region 10A between the top face of the lower semiconductive multilayered mirror 12 and the bottom face of the upper semiconductive multilayered mirror 11. In the present invention, however, the region 10B including parts of the upper semiconductive multilayered mirror 11 and the lower semiconductive multilayered mirror 12 in addition to the region 10A is referred to as a resonator 10B. Furthermore, in some cases, the protrusion 10C may be referred to as a resonator 10C, because the diameter and the shape of the resonator represent the diameter and the shape of the image of the resonator 10A projected on the xy plane, and are determined by the shape of the protrusion 10C (the image projected on the xy plane). In this specification, the protrusion is called a resonant column.

An upper electrode 14 comes into contact with a contact layer 15 through which a current is impressed to the active layer 13. Since the active layer 13 in which the current is impressed has a gain with respect to light, the light is amplified by stimulated emission to cause laser oscillation when the light moves back and forth between the upper semiconductive multilayered mirror 11 and the lower semiconductive multilayered mirror 12. A portion of the light confined in the resonator 10A (a resonator in the general meaning) passes through the upper semiconductive multi-layered mirror 11 and emerges as a laser beam from an opening 16 to the exterior.

In a surface-emitting-type semiconductor laser emitting a wavelength of 1 $\mu$m or less, the lower semiconductive multilayered mirror 12 to the contact layer 15 are deposited onto a GaAs substrate 17 by an organometallic vapor phase deposition process or a molecular beam epitaxial process, while modifying the composition of the compound semiconductive layers. Next, the resonant column 10C is formed by photolithography and reactive ion etching, and the upper electrode 14 and a lower electrode 18 are formed by a photolithographic process and a metal deposition process. These processes are well known processes. In an actual surface-emitting-type semiconductor laser, an insulating layer is provided so that no current is impressed through regions other than the contact region between the upper electrode 14 and the contact layer 15; however, this is not depicted in FIG. 1. The surface-emitting-type semiconductor laser may not have a resonant column 10C, as will be described in the third embodiment. A general surface-emitting-type semiconductor laser has been described above.

The surface-emitting-type semiconductor laser in accordance with the present invention has strain generating sections 19 adjacent to the resonator 10B. In FIG. 1, two strain generating sections are provided on a straight line which passes through the center of the resonator 10B and is parallel to the y-axis so as to sandwich the resonator 10B. The strain generating sections 19 come into close contact with the semiconductive layer continuously extending from the resonator and apply stress to the semiconductive layer. Herein, the semiconductive layer represents a region formed of semiconductors, such as the active layer 13, the lower semiconductive multilayered mirror 12, the upper semiconductive multilayered mirror 11, and an interlayers for connecting these. Such a strain generating section 19 is formed by forming a thin film of a metal, dielectric material or semiconductor with a predetermined thickness by a vacuum evaporation process, a sputtering process, or a chemical vapor deposition process, and then patterning it by combining a photolithographic process with a reactive ion etching process. When a thin film of a different material is formed on a substrate, tensile stress or compressive stress necessarily occurs at the boundary of the substrate and the thin film or in the interior of the thin film, depending on the material and conditions. When the thin film is removed so that it remains at a part, the stress is applied to only the part that will function as the strain generating section 19 for generating strain. The stress generally increases as the thickness of the thin film increases, and when it becomes higher than the bonding force between the substrate and the thin film the thin film separates from the substrate. Thus, a predetermined thickness is a thickness not causing separation when a sufficient stress is applied to the semiconductive layer.

Figure 2:
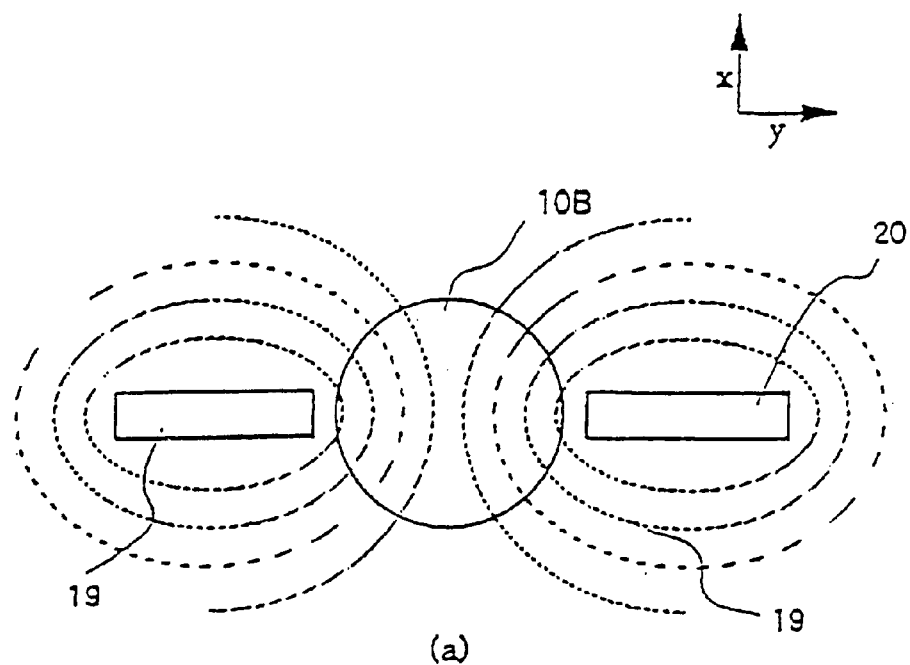
FIG. 2 is a schematic view for illustrating operation of a surface-emitting-type semiconductor laser in accordance with the present invention.
Figure 2:
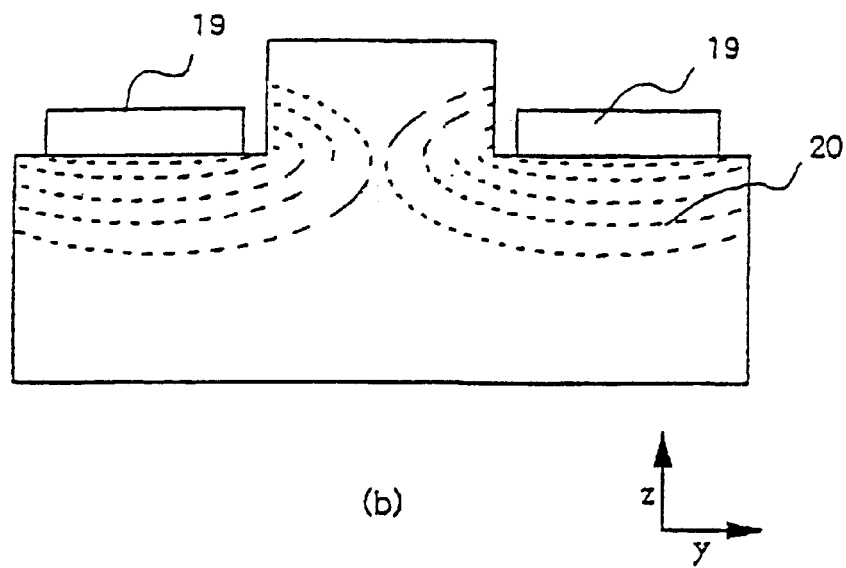

FIG. 2 conceptually shows a state of stress from the resulting strain generating section 19 to the semiconductive layer and the resonator 10B. Dotted lines in FIG. 2 represent contour lines 20 showing the stress (absolute value) which is higher near the strain generating section 19 and lower far from the section. When the strain generating section 19 is disposed in the proximity of the resonator 10B, the stress is also applied to the resonator 10B to generate strain in the resonator 10B.

Strain in the resonator 10B produces two effects. First, the resonator 10B is optically not isotropic in the xy plane because of generation of birefringence. In FIG. 2, a difference in birefringence generally occurs between the light beams polarized in the x-axis direction and y-axis direction; hence, these two directions generate an intrinsic mode in the resonator. Thus, laser beams obtained by laser oscillation are polarized in the x-axis or y-axis, and polarization direction can be stabilized. Light beams polarized in a direction other than the x-axis or y-axis, for example, a direction rotating by 30 degrees from the x-axis, are not generated.

The second effect is a predominant gain with respect to light beams polarized in a specific direction as a result of strain in the active layer 13. This is caused by a phenomenon in which the gain increases or decreases with a change in the band structure which corresponds to a change in the atomic distance when the atomic distance changes slightly due to strain generated by the stress. When the strain is anisotropic, the gain is predominant with respect to polarized light in a specific direction. In FIG. 2, the x- or y-axis is the predominant direction. The predominant direction depends on the direction of the stress applied to the semiconductor, that is, tensile stress or compressive stress, and the type of semiconductor forming the active layer.

As a result of these two effects, the surface-emitting-type semiconductor laser provided with a strain generating section 19 can emit a laser beam polarized in a specific direction. Even when the impressed current is varied to change the optical output, the direction of the polarized light does not change nor does the switching phenomenon occur. Accordingly, by providing the strain generating section 19 adjacent to the resonator 10B, the polarized light can be controlled.

Figure 3:
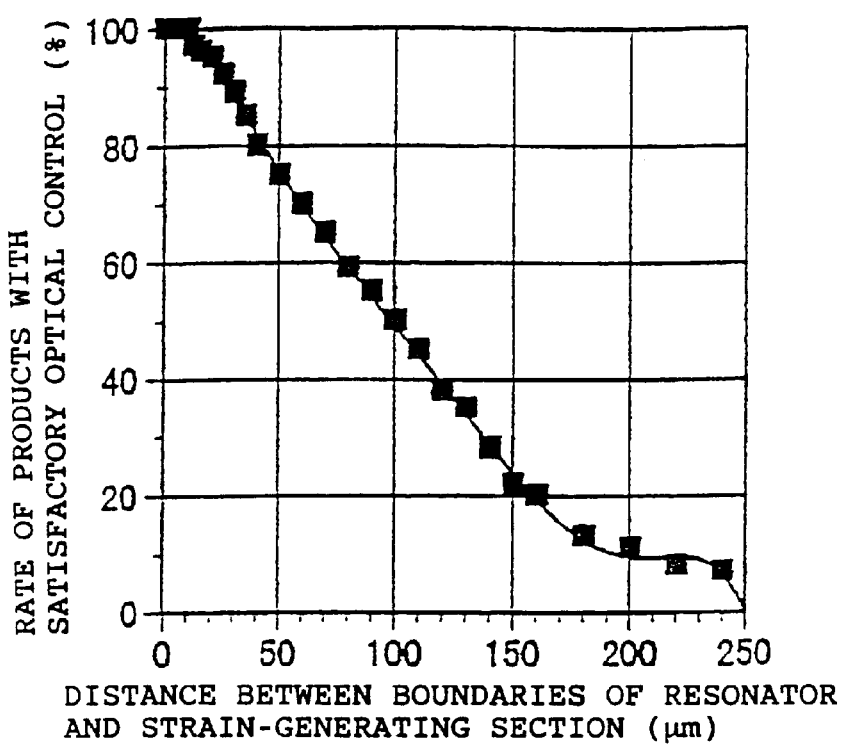
FIG. 3 shows a relationship between the distance between the boundary of a strain generating section and the boundary of a resonator and controllability of a polarization plane.

Surface-emitting-type semiconductor lasers having different distances between the resonator 10B and the strain generating section 19 were produced to measure the direction of the polarized light for the purposes of studying the relationship between the distance and the controllability of polarization. The results are shown in FIG. 3. The abscissa in FIG. 3 shows the distance between the boundary of the resonator 10B and the boundary of the strain generating section 19, and the ordinate shows the rate of the surface-emitting-type semiconductor laser within ±2 degrees of the polarization direction from the x-axis. When the distance is 100 $\mu$m, 50% or more of devices satisfy the range. Thus, a distance of 100 $\mu$m or less is effective to control polarization. The distance must be 40 $\mu$m or less for achieving a rate of 80% or more, and be 20 $\mu$m or less for a rate of 95% or more. When the distance is 10 $\mu$m or less, 100% of the surface-emitting-type semiconductor lasers emit polarized light in the x-direction; hence this is the most preferable distance.

Second Embodiment

Although the first embodiment showed a configuration of a strain generating section 19 composed of a thin film adhered to a semiconductive layer, strain is generated in a dielectric layer provided in a semiconductive layer or generated in the semiconductive layer in the second embodiment.

Figure 4:
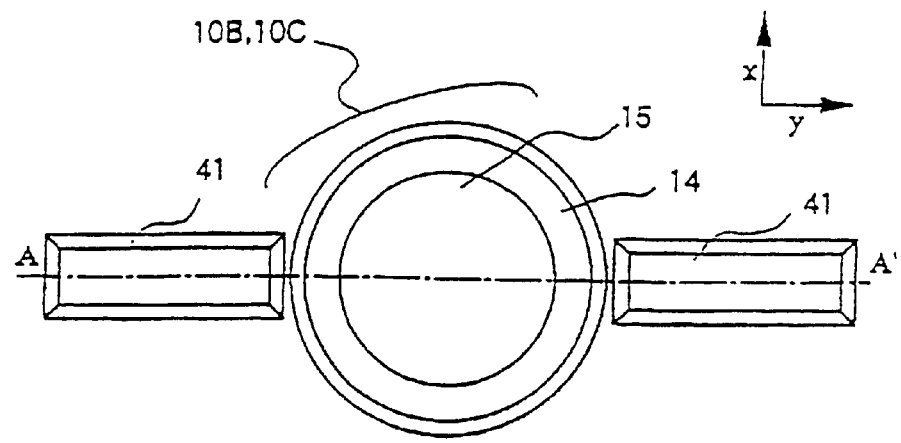
FIGS. 4(a) and 4(b) show a configuration and a cross-section, respectively, of a second embodiment of a surface-emitting-type semiconductor laser in accordance with the present invention.
Figure 4:
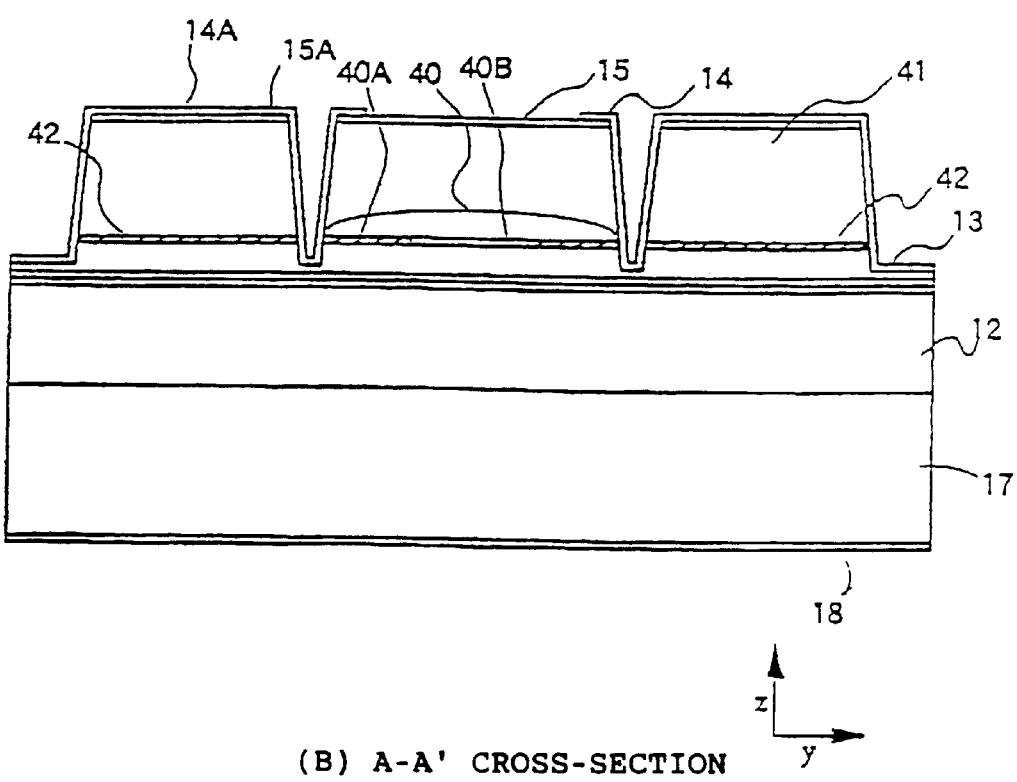

FIG. 4 includes a schematic view and a cross-sectional view of a surface-emitting-type semiconductor laser in this embodiment. As in the first embodiment, a current is impressed to an active layer 13 through a resonator consisting of a lower semiconductive multilayered mirror 12, an upper semiconductive multilayered mirror 11 and the active layer 13; through an upper electrode 14 and through a contact layer 15. A difference in the resonator 10B from that in FIG. 1 for the first embodiment is provision of a current constriction section 40. The current constriction section 40 consists of a periphery 40A composed of an insulating (dielectric) material and a center 40B composed of a semiconductor, so that the current impressed from the upper electrode collectively flows in the center of the active layer.

The current constriction section 40 having such a bimodal configuration is produced by selective oxidation of an AlAs layer. This uses ready oxidizing characteristics of the AlAs layer in a hot water vapor atmosphere. When semiconductive layers, such as a semiconductive multilayered mirror and an active layer, are deposited, the AlAs layer is formed at a position for providing the current constriction section 40. When a region other than the resonant column 10C is etched by a photolithographic process and a reactive ion etching process, the etching depth is controlled so that the cross-section of the AlAs layer appears at the side of the resonant column 10C. After completion of etching, the device is exposed to a water vapor atmosphere at approximately 400° C. for 1 to 30 minutes so that only the AlAs layer reacts with water vapor to form aluminum oxide. The region forming aluminum oxide depends on the exposure time to water vapor, and oxidation starts from the cross-section and gradually proceeds to the interior. Thus, by adjusting the exposure time in water vapor, the current constriction section 40 having an electrically conductive AlAs layer near the center of the resonator and an electrically insulating aluminum oxide layer near the periphery of the resonator can be formed. When aluminum in the AlAs layer is replaced with gallium, oxidation proceeds from the side up to Al:Ga=98:2, but does not proceed if the Ga content is higher. Thus, the composition of the current constriction section 40 must not be higher than this Ga content, and the composition of the non-oxidized portion other than the current constriction section must be higher than this Ga content.

Such a current constriction section 40 can effectively convert a current into light beams; hence, the threshold current is decreased and the external differential quantum efficiency is improved.

The above description is for a surface-emitting-type semiconductor laser having a general current constriction section 40. The surface-emitting-type semiconductor laser in accordance with the present invention is characterized in that aluminum oxide formed for the current constriction is used as a strain source of the strain generating section.

AlAs reacts with water vapor to evolve $AsH_3$ and to form aluminum oxide. Since the volume changes in the reaction, the interface between the resulting aluminum oxide layer and the semiconductive layer generates stress so as to distort the semiconductive layer. The periphery of the current constriction section applies such stress to the resonator. Since the effect is isotropic, the polarization is not stabilized. On the other hand, strain generating sections 41 having dielectric layers 42 of aluminum oxide are provided adjacent to the resonator; hence, strain in a specific direction (anisotropic strain) is applied to the resonator 10B. As a result, the polarization plane can be stabilized by means of the optical effect described in the first embodiment.

The process for forming the aluminum oxide layer 42 in the semiconductor continuously extending from the resonator 10B by selective oxidation of the AlAs layer is effectively performed as follows. When the resonator 10B is formed by a photolithographic process and a reactive ion etching process, the protrusion 41 of the strain generating section can be simultaneously formed. Since the height of the protrusion 41 is equal to that of the resonant column 10C, the cross-section of the AlAs layer in the strain generating section 41 can be exposed. When it is exposed to a water vapor atmosphere at approximately 400° C., the aluminum oxide layer is formed. The width of the formed aluminum oxide is adjusted so that the current is effectively strained in the resonator 10B. A significantly small width does not cause a collective current in the center of the resonator, whereas a significantly large width causes increased resistance and thus adverse thermal effects.

The shape (shape projected on the xy plane) of the strain generating section 41 is designed so that the AlAs layer is completely converted into aluminum oxide within the width of the aluminum oxide. For example, the shape of the strain generating section 41 in FIG. 4 is rectangular. Since the length of the short side (length of the side in the x-axis) of the rectangular shape is smaller than double the length of the width of the formed aluminum oxide, the AlAs layer of the strain generating section is completely converted into the dielectric layer 42 of aluminum oxide during the formation of the current constriction section 40. As a result, a large strain is generated, and an excessive current is avoided. When the strain generating section and the resonator are simultaneously formed, the contact layer 15A comes into contact with the upper electrode 14A above the strain generating section, as described above. When a current is impressed from the electrode, an excessive current flows which does not contribute to laser oscillation, and this is not desirable in view of heat generation and electrical power consumption. When the AlAs layer is completely converted into the aluminum oxide layer 42, the current passage is removed, and thus an excessive current does not flow. An AlAs layer of 9 $\mu$m or less is not substantially affected by an excessive current, thus it is not always necessary to completely remove the layer. If anything, satisfactory results are obtained in view of reliability of the device when the AlAs layer remains in the strain generating section 41.

A semiconductor may be used instead of the dielectric material, such as aluminum oxide. A semiconductive layer having lattice dislocation and being capable of introducing strain is inserted. When a strain generating section 21 as shown in FIG. 4 is formed, anisotropic strain is applied to the active layer, as in aluminum oxide.

Figure 5:
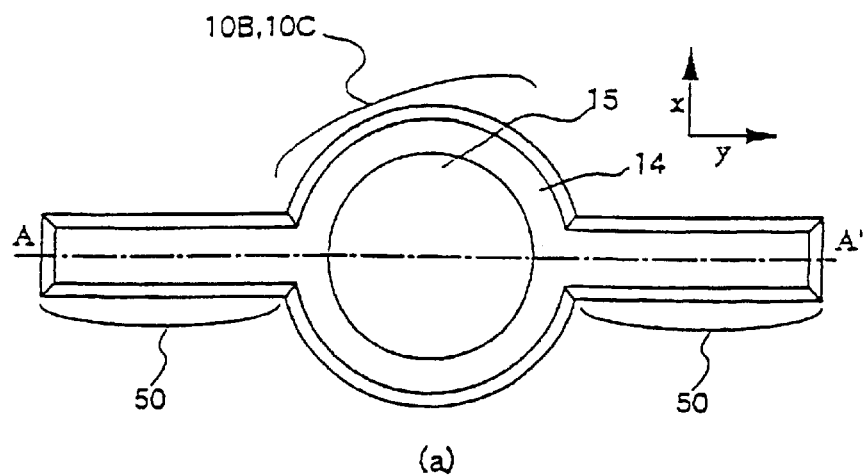
FIGS. 5(a) and 5(b) show a configuration and a cross-section, respectively, of a third embodiment of a surface-emitting-type semiconductor laser in accordance with the present invention.
Figure 5:
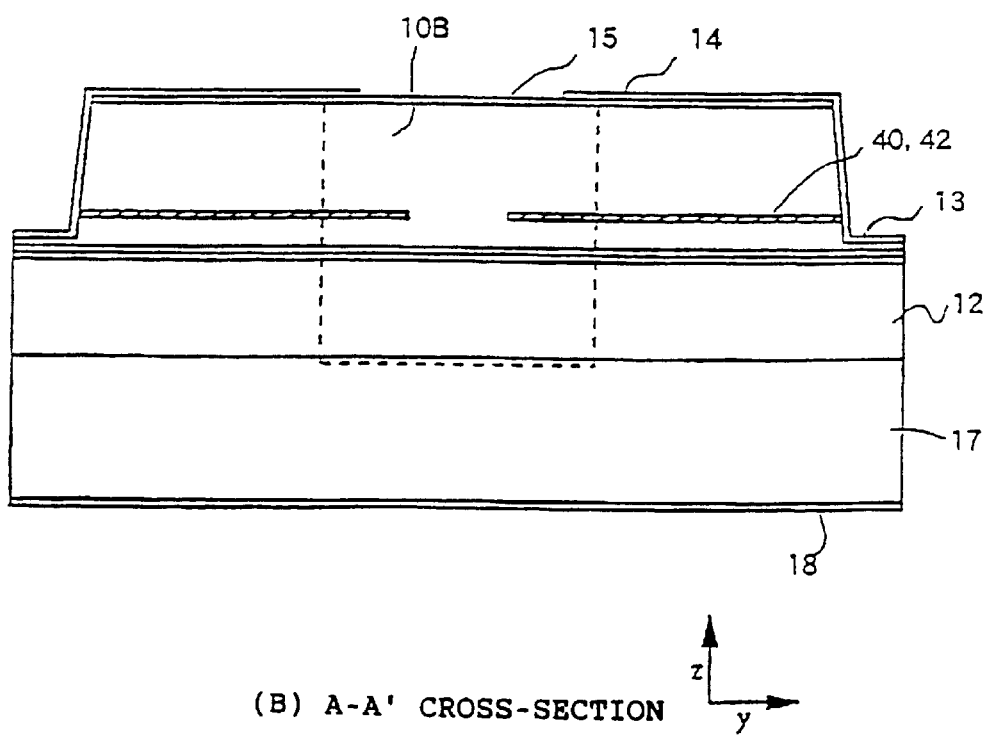

The relationship between the distance from the strain generating section 41 to the resonator 10B and the controllability of polarization was studied. There were no differences from the results obtained in the first embodiment. The configuration in this embodiment is particularly effective when the distance from the strain generating section to the resonator 10B is zero, that is, these are continuously arranged. FIG. 5 shows an embodiment of such a configuration. A strain generating section 50 is continuously formed from a resonator 10B. Such a configuration of the strain generating section 50 integrated with the resonator 10B can most effectively apply strain to the resonator 10B. Since the configuration does not have technical obstacles and cost-increasing factors, it is the most practical configuration.

Accordingly, polarization can be controlled and stabilized by strain which is generated by embedding a dielectric material or a different semiconductor into a semiconductor.

Third Embodiment

In the first and second embodiments, each strain generating section is formed so as to protrude, whereas this embodiment describes that an indented strain generating section 60 is also effective.

Figure 6:
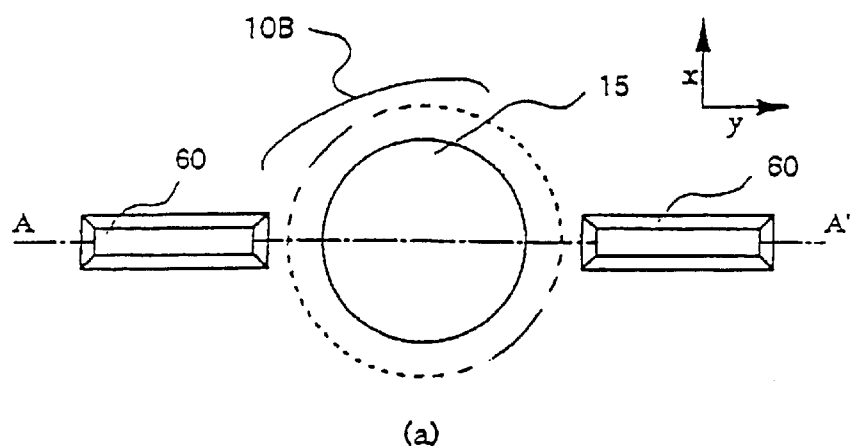
FIGS. 6(a) and 6(b) show a configuration and a cross-section, respectively, of a fourth embodiment of a surface-emitting-type semiconductor laser in accordance with the present invention.
Figure 6:
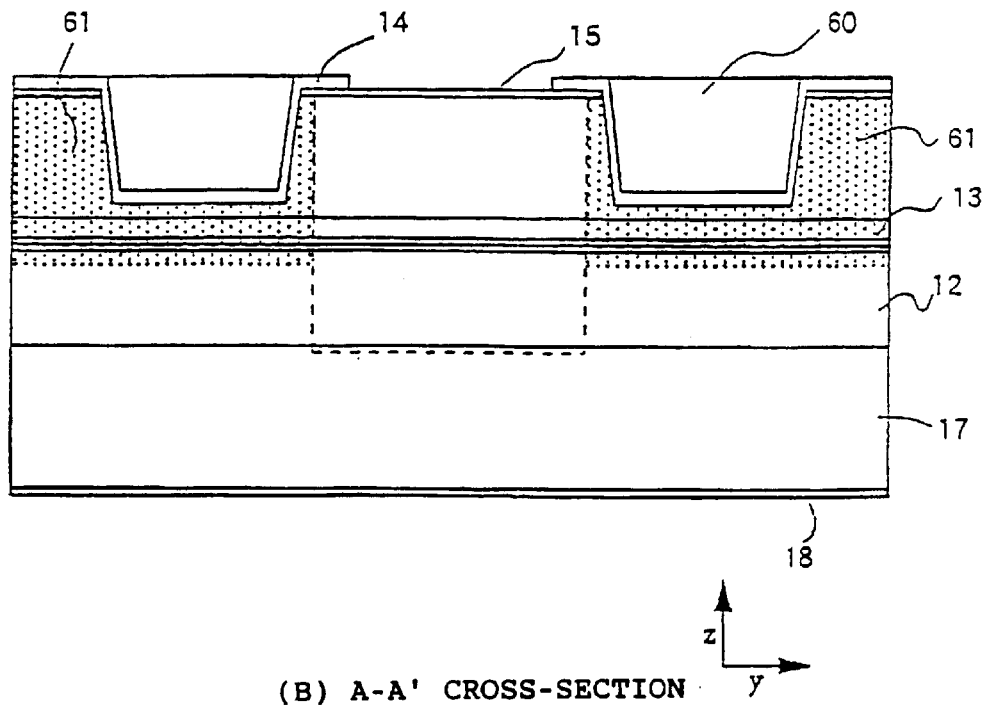

FIG. 6 shows an embodiment in accordance with the present invention. The above-described embodiments include devices having resonant columns 10C. This embodiment shows a device which does not have a resonant column but has a resonator 10B formed by insulation of a semiconductive layer by means of proton implantation. Since a current impressed from an upper electrode 14 does not pass through the region 61 insulated by the proton implantation, it flows in an activation layer 13 in the resonator 10B. The mechanism by which the emitted light is amplified to cause laser oscillation in the active layer 13 when moving back and forth between the upper semiconductive multilayered mirror 11 and the lower semiconductive multilayered mirror 12 is the same as that in the above-described surface-emitting-type semiconductor lasers.

In the surface-emitting-type semiconductor laser in accordance with the present invention, parts of the semiconductive layer around the resonator 10B are etched to form rectangular shapes, as shown in FIG. 6. The indented sections formed by the etching are strain generating sections 60. The strain generating sections 60 are formed by implanting protons using an ion implantation accelerator, and then by a photolithographic process and a reactive ion etching process. Next, a $SiO_2$ protective film and an upper electrode 14 are formed by a vacuum evaporation process, a sputtering process, and a CVD process.

It was confirmed that such an indented strain generating section 60 could also control polarization. The possible reasons that formation of the indented section can control polarization are as follows, although these are not completely understood.

It is presumed that the original semiconductive layer has internal stress. Although it is said that GaAs and AlAs have excellent lattice matching and thus do not generate strain, strictly speaking, the matching is not perfect. When the semiconductive multilayered mirrors 11 and 12, the active layer 13, and the contact layer 15 are formed while varying the ratio of aluminum to gallium in AlGaAs, slight internal stress occurs. Since it is an in-plane isotropic stress, this does not generate large stresses. When a strain generating section 60 is provided by partly removing the semiconductive layer, a part of the stress will be released to form an anisotropic stress distribution that causes strain in the resonator.

The proton implantation is also a factor for increasing internal stress. Since axisymmetrical proton implantation is performed with respect to the center of the resonator 10B, the resulting strain does not have an amplitude capable of controlling the polarization. Removal by etching of a part of the proton-implanted semiconductive layer forms an anisotropic stress distribution that will cause strain in the resonator 10B.

The strain in the resonator 10B formed for these reasons generates birefringence and polarization dependence of the gain in the active layer, as described above; hence, the polarization is stabilized.

A possible reason other than strain is an optical contribution. Reflection of light at the interface between the strain generating section 60 and the semiconductive layer may cause a difference in loss between polarization modes of the reflected light and the light passing straight therethrough.

The deeper the indented strain generating section 60, the more effective it is, but the laser efficiency is higher when the depth thereof is less than the depth of the proton implantation.

Fourth Embodiment

Figure 7:
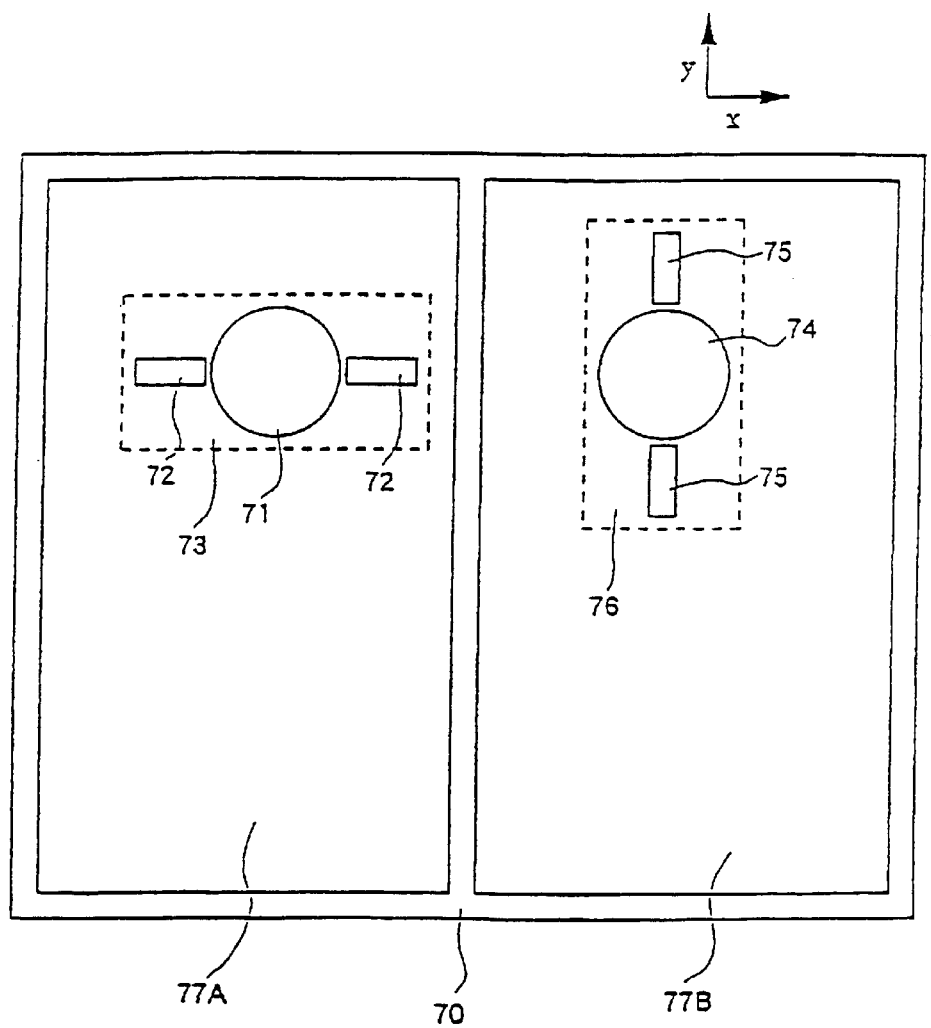
FIG. 7 shows a configuration of a fifth embodiment of a surface-emitting-type semiconductor laser in accordance with the present invention.

A surface-emitting-type semiconductor laser can produce a structure having a plurality of light emitting sections, that is, a semiconductor array on one semiconductive substrate. As shown in FIG. 7, a combined arrangement of surface-emitting-type lasers in accordance with the present invention having an orthogonal arrangement of strain generating sections enables emission of two types of laser beams having an orthogonal polarization direction on one semiconductive piece 70. A surface-emitting-type semiconductor laser 73 with an arrangement in the x-axis direction of a resonator 71 and a stress-adding section 72 and a surface-emitting-type semiconductor laser 76 with an arrangement in the y-axis direction of a resonator 74 and a stress-adding section 75 are formed on a semiconductor by a photolithographic process. A current applied to an electrode 77A drives the surface-emitting-type semiconductor laser 73 with the x-axis arrangement of strain generating section 72. A current applied to an electrode 77B drives the surface-emitting-type semiconductor laser 76 with the y-axis arrangement of strain generating section 75. When these two surface-emitting-type semiconductor lasers are driven by the electrodes 77A and 77B, laser beams having orthogonal polarization directions can be output. The strain generating section 72 of the x-axis arrangement should affect the adjacent resonator 74 provided with the strain generating section 75 of the y-axis arrangement; however, mutual interference in polarization control is not observed when the distance between these two resonators 71 and 74 is 30 $\mu$m or more and is larger than the distance between the adjacent resonator itself and the strain generating section thereof. The direction of polarization is controlled by the direction of the strain generating section which is nearest to the resonator.

When the strain generating section is arranged in an appropriate direction, a laser beam having a polarization plane corresponding to the direction of the arrangement is obtained; hence, this is useful for the purpose of modulation of polarization.

The above-mentioned embodiments show circular resonators (the projected shape on a xy plane) and rectangular strain generating sections; however, the present invention in not intended to be limited to these shapes. The polarization plane is controllable when the resonator is cubic or rectangular and the strain generating section is circular, elliptic, rhombic, or triangular. In the production of each resonator in these embodiments, the semiconductive layer is removed by a reactive ion etching process and proton implantation is performed; however, the present invention is not limited to these processes.

Industrial Applicability

The surface-emitting-type laser can be used when assembled in an optical disk head, a communication device, and the like.

What is claimed is:

1. A surface-emitting-type semiconductor laser, comprising:

a semiconductive substrate;

a resonator disposed over and perpendicular to the semiconductive substrate;

a laser beam from the resonator being emitted perpendicular to a surface of the semiconductive substrate; and at least one indented strain generating section provided adjacent to the resonator such that strain generated by the at least one indented strain generating section controls a polarization of the laser beam, the at least one indented strain generating section having a height that is substantially equal to a height of said resonator.

2. The surface-emitting-type semiconductor laser according to claim 1, the strain generating section comprising one of a metal, a dielectric material, or a semiconductor material formed so as to be bonded to a semiconductor continuously extending from the resonator.

3. The surface-emitting-type semiconductor laser according to claim 1, the strain generating section comprising a dielectric material or a semiconductor material formed in a semiconductor continuously extending from the resonator.

4. The surface-emitting-type semiconductor laser according to claim 1, said resonator having a current constriction section.

5. The surface-emitting-type semiconductor laser according to claim 1, wherein the strain generating section has a short side, and the diameter of the resonator is greater than the length of the short side of the strain generating section.

* * * * *